United States Patent [19]

Bose et al.

[11] Patent Number: 4,691,319

[45] Date of Patent: Sep. 1, 1987

[54] METHOD AND SYSTEM FOR DETECTING A PREDETERMINED NUMBER OF UNIDIRECTIONAL ERRORS

[75] Inventors: Bella Bose, 4002 NW. Witham Hill Dr., No. 105, Corvallis, Oreg. 97330; Der J. Lin, Corvallis, Oreg.

[73] Assignee: Bella Bose, Corvallis, Oreg.

[21] Appl. No.: 746,109

[22] Filed: Jun. 18, 1985

[51] Int. Cl.$^4$ ............................................. G06F 11/10
[52] U.S. Cl. ......................................... 371/54; 371/40
[58] Field of Search ....................... 371/37, 53, 54, 49, 371/40

[56] References Cited

U.S. PATENT DOCUMENTS

| | | | |
|---|---|---|---|
| 2,552,629 | 5/1951 | Hamming et al. | 371/37 |
| 2,977,047 | 3/1961 | Bloch | 371/53 |
| 3,218,608 | 11/1965 | Barbeau | 371/54 |
| 3,273,119 | 9/1966 | Helm | 371/37 |
| 3,458,860 | 7/1969 | Shimabukuro | 371/49 |
| 3,460,117 | 8/1969 | Cohn et al. | 371/49 |
| 3,753,225 | 8/1973 | Liddell | 371/54 |
| 4,498,177 | 2/1985 | Larson | 371/52 |

OTHER PUBLICATIONS

Peterson et al., Error Correcting Codes, MIT Press, 1972, pp. 1-11, 40, 47, 116-125, 206-265 and 268-309.
Berger, A Note on Error Detecting Codes for Asymmetric Channels, Information and Control, vol. 4, Mar. 1961, pp. 68-73.
Freiman, Optimal Error Detecting Codes for Completely Asymmetric Binary Channel, Information and Control, vol. 5, Mar. 1962, pp. 64-71.

*Primary Examiner*—Charles E. Atkinson
*Attorney, Agent, or Firm*—William A. Birdwell

[57] ABSTRACT

A method and system for employing systematic check codes for detecting a predetermined number of unidirectional errors in the transmission of data. In accordance with the invention check codes are produced from information codes such that for all possible pairs of (n+m)-bit data words formed by a predetermined set of n-bit information codes and corresponding m-bit check codes, either the pair of words is unordered or the Hamming distance between the data words of the pair is greater than or equal to t+1, where t is the maximum number of unidirectional errors that can be detected. First check codes are generated at a data source, second check codes are generated from the received information code at a data sink, and the received first check codes are compared with the second check codes to determine the existence of a disparity. Sequential and combinational logic circuits are provided for producing check codes having two or more bits.

8 Claims, 11 Drawing Figures

METHOD AND SYSTEM FOR DETECTING A PREDETERMINED NUMBER OF UNIDIRECTIONAL ERRORS

BACKGROUND OF THE INVENTION

This invention relates to the use of check codes in data transmission systems for detecting errors in the transmission of data, and particularly to a method and system for employing systematic check codes for detecting a predetermined number of unidirectional errors in the transmission of data.

In a digital computer or communications system it is desirable, and sometimes vital, that data be reliable when stored, retrieved, communicated, or otherwise manipulated. The complexity of modern computer and communication systems makes it impractical to depend solely upon reliable components and devices for reliable system operation. Some redundancy is needed for detection of errors, which will invariably occur as information is being stored, retrieved, transferred, or manipulated.

The types of error patterns which occur in memory, logic, and arithmetic units are many and varied. However, they can broadly be classified as "symmetric," "asymmetric," and "unidirectional" errors. Error patterns in digital systems are said to be symmetric when both 1 to 0 and 0 to 1 errors can occur simultaneously in a data word. When the errors produced in a data word by a digital system are of only one type, say 1 to 0, the error pattern is called asymmetric. In the latter case the other type of error, that is, 0 to 1, will never occur in any data word. When the errors produced in a data word by a digital system may be either 0 to 1 or 1 to 0, but not both simultaneously, the error pattern is called unidirectional. In the latter case, while the data word has only 0 to 1 errors or only 1 to 0 errors, the type of errors are not a priori determinable. In addition, errors may be considered as "bursts," that is, errors which lie within a set of adjacent bits of a data word.

All or part of a digital data system may be characterized as having a data source for producing a data word, a data sink for accepting the data word, and a data transmission channel for transmitting a data word from the data source to the data sink. One method for detecting errors that occur in the transmission of a data word from the data source to the data sink is to incorporate in the data word prior to transmission a check code, comprising one or more check bits, and employing those check bits at the data sink to detect the occurrence of a transmission error. An example of such a system is disclosed in Hamming et al. U.S. Pat. No. 2,552,629. Such an apparatus is capable of detecting up to three symmetric errors or correcting one symmetric error. Moreover, an extensive theory of symmetric error control coding has been developed, as discussed in E. R. Berlekamp, "Algebraic Coding Theory" (McGraw-Hill, 1968); S. Lin, "An Introduction to Error-Correcting Codes" (Prentice-Hall, 1970); W. W. Peterson and E. J. Weldon, "Error Correcting Codes" (MIT Press, 1972); and N. J. A. Sloane and F. J. MacWilliams, "The Theory of Error Correcting Codes" (North-Holland, 1978).

The error patterns of some recently developed very large scale integrated circuits are of the unidirection type. While symmetric error code detection systems could be utilized to detect errors occuring in such circuits, each check bit included in a data word will necessarily decrease the rate at which information may be transmitted over a data channel. Moreover, in many digital data systems the probability of more than a predetermined number of errors occuring is so low that it is not cost effective to attempt to detect conditions where more than that number of errors occurs. It would therefore be desirable to minimize the number of check bits required to detect errors by detecting only up to a predetermined number of unidirectional errors. It is also desirable, in employing check codes, to use systematic codes, that is, codes in which the information bits are separately identified from the check bits, so that encoding, decoding, and data manipulation, can be performed in parallel bit logic. The unidirectional error codes previously known are non-systematic constant weight codes and systematic Berger-Freiman codes, as described in J. M. Berger, "A Note on Error Detecting Codes for Asymmetric Channels," *Information and Control*, Vol. 4, pp. 68–73 (March, 1961), and C. V. Freiman, "Optimal Error Detecting Codes for Completely Asymmetric Binary Channel," *Information and Control*, Vol. 5, pp. 64–71 (March, 1962), both of which detect all unidirectional errors in a data word. However, the aforementioned codes are not optimal when only up to a predetermined number of errors greater than one need be detected.

SUMMARY OF THE INVENTION

The present invention overcomes the drawbacks of previous error detection systems and check codes by providing a method and system for producing optimal, or near optimal, systematic check codes for detection of a predetermined number of unidirectional errors. The invention employs a circuit at the data source for generating a first check code, a circuit for transmitting the first check code along with an information code over a transmission channel, a circuit at the data sink for producing a second check code from the received information code based upon the same criteria as the first check code, and a comparator for ascertaining the existence of any disparity between the first check code and the second check code. In accordance with the invention the check codes are produced such that for all possible pairs of $(n+m)$-bit data words formed by a predetermined set of n-bit information codes and corresponding m-bit check codes, either the pair of words is unordered or the Hamming distance between the data words of the pair is greater than or equal to $t+1$, where t is the predetermined maximum number of errors that can be detected. The Hamming distance between any two words is the number of bit positions in which they differ. Specific methods and circuits for constructing check codes for two or more errors in a data word are provided.

Unlike symmetric error detecting codes for detecting a predetermined number of errors, the uni-directional error detection codes according to the present invention need only be a fixed number of check bits, independent of the number of information bits. Furthermore, the number of check bits needed for the detection of a predetermined number of unidirectional errors is less than the number needed for the detection of the same number of symmetric errors. Parallel encoding and decoding circuits for utilization of codes according to the present invention codes are easily implemented and, thus, the codes are suitable for high speed computer and information systems.

Accordingly, it is a principal objective of the present invention to provide a novel data error detection method and system.

It is another objective of the present invention to provide a method and system for detecting a predetermined number of unidirectional errors in a data word.

It is yet another objective of the present invention to provide a data error detection method and system wherein optimal, or near optimal, systematic check codes are employed.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
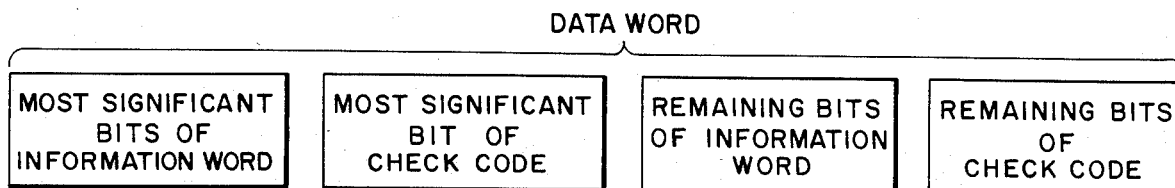
FIG. 1 is a block diagram illustrating a typical digital data processing system in which the error detection system of the present invention would be employed.

Referring to FIG. 1, all or a portion of a digital computer or communications system may be represented by a data source 10, coupled to a transmission channel 12, coupled in turn to a data sink 14. The data source 10 could be any device that produces an n-bit digital information code in parallel or serial format. The transmission channel 12 could be any device or set of devices for receiving a data word from the data source 10 and making it available to the data sink 14, which could be any device capable of accepting a digital data word. For example, the data source might be a digital computer, the data sink might be a random access memory, and the transmission channel might be an interface circuit between the computer and the random access memory. For another example, the data source might be a digital computer, the transmission channel might be a complex telecommunications system, and the data sink yet another computer. In certain types of such systems the errors produced in the transmission channel are principally unidirectional in nature and it is sufficient to detect errors only if they occur in groups having less than or equal to a predetermined number t of errors within any given data word (hereinafter referred to as "t-unidirectional errors").

It has been found that a set of data words is capable of detecting t-unidirectional errors if and only if for all pairs of data words X and Y within a set C of data words, either X and Y are unordered, or the Hamming distance between X and Y is greater than or equal to $t+1$. A pair of words $X=(X_1, X_2, \ldots X_n)$ and $Y=(Y_1, Y_2, \ldots Y_n)$ is said to be ordered if whenever $Y_i=1$ then $X_i=1$ for all $i=1, 2, \ldots n$, or vice-versa. The Hamming distance between two data words is the number of bit positions in which they differ. For example, the Hamming distance between $X=(11001)$ and $Y=(01100)$ is 3. Thus, check codes may be constructed such that, when added to corresponding information codes, the resultant data words satisfy the aforementioned condition for t-unidirectional errors within the information code.

In accordance with the invention, check codes for detecting up to two or three errors need two or three check bits, respectively, independent of the number of information bits. In these cases, it has been found that the check code may be generated by either of two methods. First, the number of zeros in the information code is determined and modulo $2^m$ is taken of that number, where m=the number of check bits. A modulo operation is a mathematical operation that yields the remainder function of division; for example, 39 modulo 6=3. It is to be understood throughout this description, however, that mathematical operations described herein would in practice be performed in binary arithmetic.

Alternatively, the number of ones in a given information code is determined, modulo $2^m$ is taken of that number, and the result is complemented. In either case, the resultant check code is combined with the corresponding information code, typically by concatenation.

By the use of four check bits, up to 6 errors can be detected, and the check code is generated by determining the number of zeros in the information code, taking modulo 8 of that number, and adding 4 to the result.

Where the number of check bits m is greater than or equal to 5, one method for generating check codes is to determine the number of zeros in a given information code, take modulo $2^{m-1}$ of that number, and add $2^{m-1}$ to the result. These codes can detect up to $2^{m-2}+m-2$ errors. Another method to be used where m is greater than or equal to 5, is to determine the number of zeros in the information code and take modulo $6 \times 2^{m-4}$ thereof. The three most significant bits of the result will be 000, 001, 010, 011, 100, or 101. These three bits are mapped to 2-out-of-4 vectors by any one-to-one function f. For example, f(000)=0011, f(001)=0101, f(010)=0110, f(011)=1001, f(100)=1010, and f(101)=1100. Such codes can detect up to $5 \times 2^{m-4}+m-4$ errors.

Figure 2:
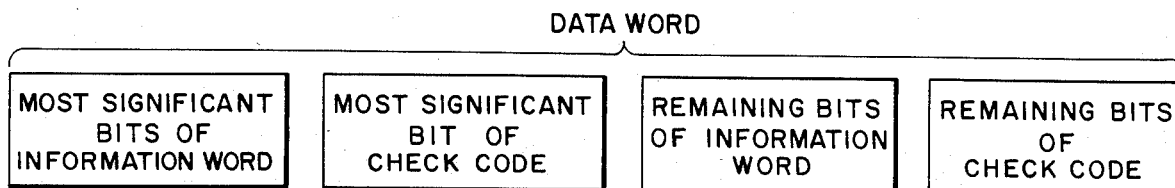
FIG. 2 illustrates the organization of a data word employed in a burst error detection system.

In addition, it has been found that t-unidirectional error codes can be employed to detect burst errors. A burst error of length L is one in which the error bits are confined within a cluster of L-adjacent bits of the data word. Check codes produced in accordance with the present invention can detect burst unidirectional errors of length up to $2^{m-1}$ information and check bits, m representing the number of check bits. The code is generated by determining the number of zeros found in the information symbol and taking modulo $2^m$ of that number. Instead of concatenating the check symbol to the information symbol, the bits of a data word having n information code bits and m error code bits are arranged in a sequence beginning with the $n-2^{m-1}$ most significant bit of its corresponding check code, followed by the remaining bits of the information code, followed by the remaining bits of the check code. This is illustrated in FIG. 2 hereof. As a result of this arrangement, for a burst of unidirectional errors of length at most $2^{m-1}$, the most significant bit of the check code and some other check bit cannot simultaneously be in error.

Figure 3A:
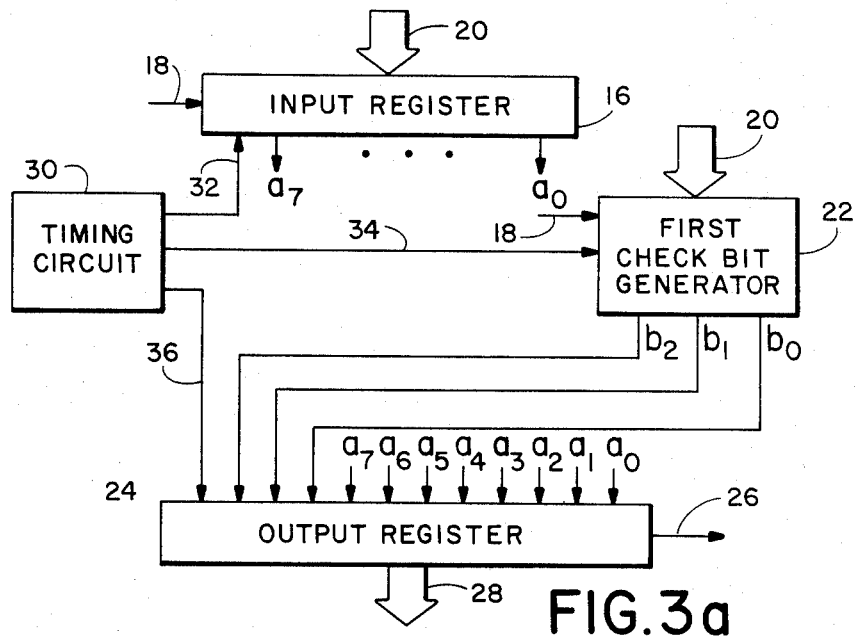
FIG. 3(a) shows a data source adapted for implementation of the present invention.

Turning now to FIG. 3(a), showing a generalized data source adapted for implementation of an embodiment of the invention, an input register 16 accepts an information code of selected length, for example, an eight-bit information code having bits $a_0$–$a_7$, either from a serial input 18 or a parallel input 20. A first check bit generator 22 also receives the information code from serial input 18 or parallel input 20, and generates as an output a check code, in this exemplary case, a three bit check code comprising bits $b_0$–$b_2$. As previously explained, the check bit generator may be constructed to provide two or more check bits, depending upon the number of errors to be detected, independent of the number of bits in the information code. The check bit generator may be constructed of sequential or combinational logic, as explained hereafter. An output register 24 receives the information bits $a_0$–$a_7$ from the input register in parallel, though they could also be received serially, and the check bits $b_0$–$b_2$ from the check bit generator, so that the check bits are concatenated to the end of the information bits. The resultant data word is then transmitted over a transmission channel either via a serial output 26 or a parallel output 28. All of this is controlled by a timing circuit 30 which provides control signals 32, 34, and 36 to the input register 16, the check bit generator 22, and the output register 24, respectively. The manner of construction of appropriate timing and register circuitry is commonly known to persons skilled in the art.

Figure 3B:
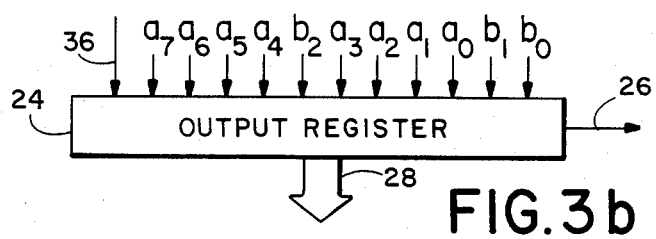
FIG. 3(b) shows a modification of FIG. 3(a) for burst error detection.

In FIG. 3(b) the information and check bits are all brought into the output register 24 in parallel, but rearranged in accordance with burst error detection, as shown in FIG. 2. Except for this arrangement of information and check code bits, and the content of the check bit generator 22, the exemplary data source for burst error detection is the same as in FIG. 3(a).

Figure 4:
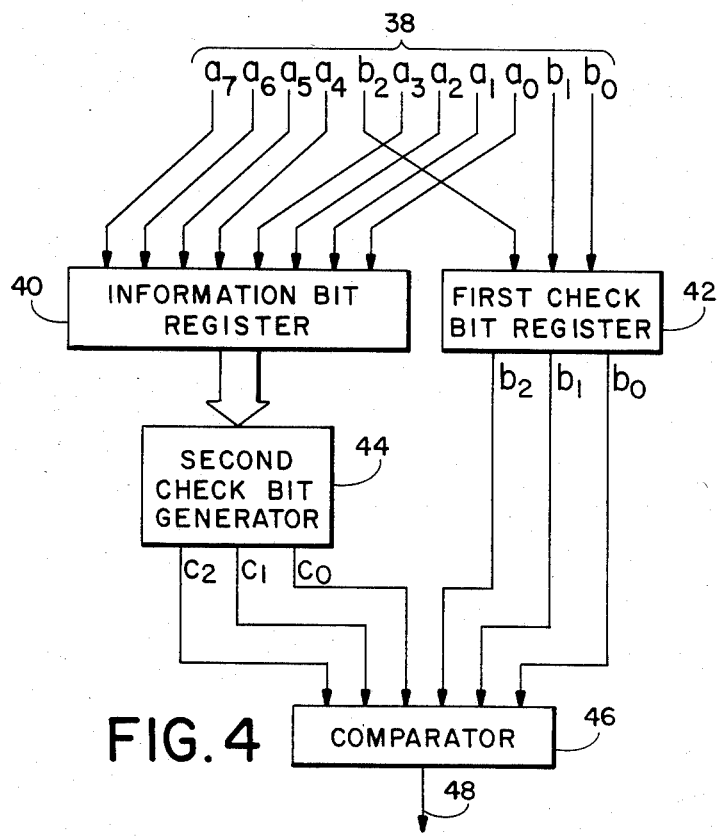
FIG. 4 shows a data sink adapted for implementation of the present invention for use with a parallel bit transmission channel.

A data sink adapted for use with a parallel transmission channel for burst error detection is shown in FIG. 4. The transmission channel lines 38 carrying information bits $a_0$–$a_7$ are fed to an information bit register 40, while those lines carrying the check bits $b_0$–$b_2$ are fed to a first check bit register 42. The bits in the information bit register 40 are then fed in parallel to a second check bit generator 44, identical in function, and ordinarily in structure, to the first check bit generator 22 at the data source for generating three check bits $c_0$–$c_2$ from the received information code. Those three check bits are then compared with the three check bits $b_0$–$b_2$ received at the data sink, which are supposed to be, but are not necessarily, the same as the transmitted check bits. The comparison is performed by a comparator 46, which produces an output, such as a one or a zero, at 48 indicating a match or a disparity, as the case may be. The registers and comparators may be constructed in a manner commonly known to persons skilled in the art.

While FIG. 4 has shown the bits of the data word arranged on the parallel transmission channel for burst error detection, it is to be recognized that the check bits could be merely concatenated on the end of the information code, as shown in FIG. 3(a), for non-burst error detection.

Figure 5A:
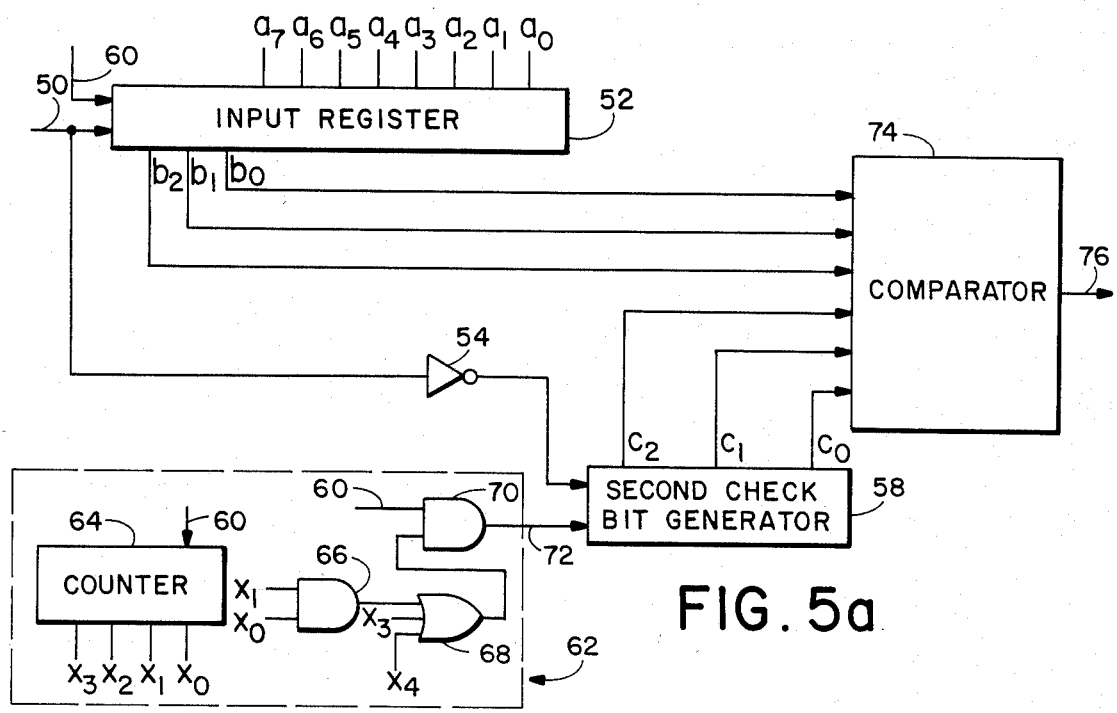
FIG. 5(a) shows a data sink adapted for implementation of the present invention for use with a serial bit transmission channel.

FIG. 5(a) shows an exemplary data sink for receiving a serial data word, including check bits. The data word is applied to input 50 of an input register 52, and through an inverter 54 to a data input of a second check bit generator 58. As the data word is applied to the input register 52, it is clocked in by clock signal 60. A timing control circuit 62, responsive to the clock signal 60, provides a gating signal to clock the information bits into the second check bit generator 58 at the appropriate times. In the case where the check bits are concatenated to the information bits, as shown in FIG. 5(a), the timing control circuit 62 comprises a modulo 11 counter 64 having outputs $X_0$–$X_3$ which are fed to an AND gate 66 and an OR gate 68, the output of the AND gate 66 also being fed to the OR gate 68, as shown in FIG. 5(a). The output of the OR gate is fed as an input to an AND gate 70, along with the clock signal 60, to produce a gating signal output 72. While the logic shown is specific to this particular application, the manner of construction and the principles of operation of such circuitry are commonly known in the art and will not be dealt with further here.

The second check bit generator 58 contains sequential logic for producing three check bits $c_0$–$c_2$ from the information bits. The sequential logic would ordinarily be the same as that employed in the first check bit generator 22 at the data source. The check bits $c_0$–$c_2$ are compared to the received check bits $b_0$–$b_2$ by a comparator 74 which produces as an output a signal 76 indicative of the presence of a match or a disparity, as previously explained with respect to FIG. 4. The information bits themselves may be obtained from the input register 52.

Figure 5B:
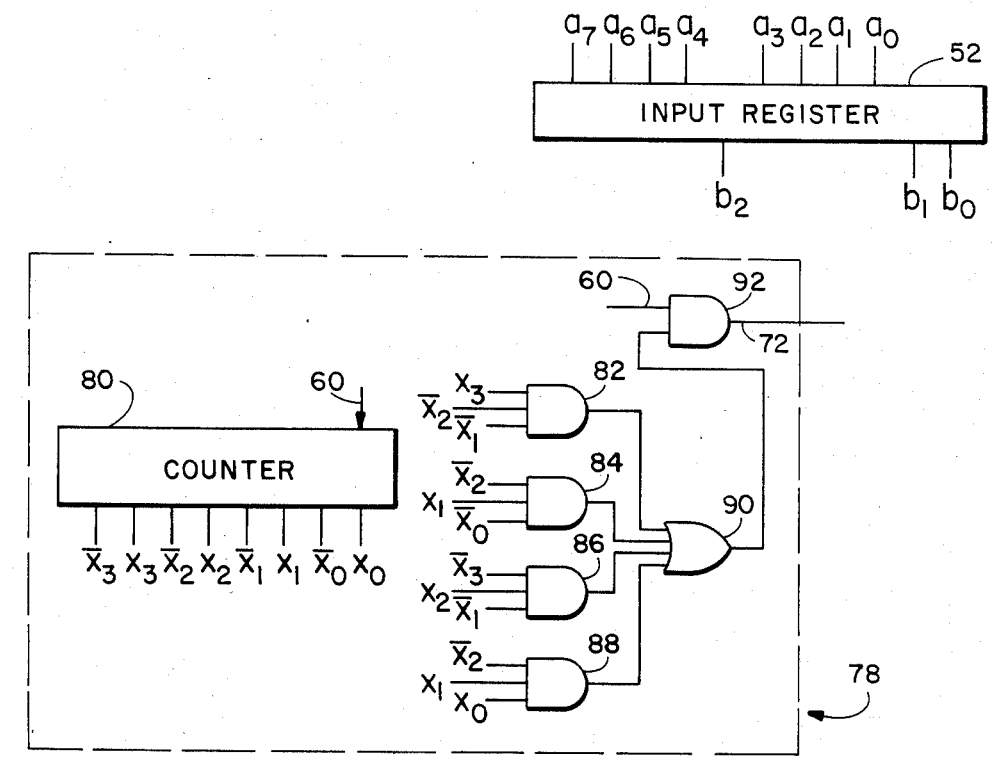
FIG. 5(b) shows a modification to the data sink of FIG. 5(a) for burst error detection.

In order to receive a data word for burst error detection, the circuit shown in FIG. 5(a) is modified as shown in FIG. 5(b), that is, a different timing control circuit 78, responsive to the clock signal 60, is provided. In the timing control circuit 78 a modulo 11 counter is provided, whose outputs drive four AND gates 82, 84, 86, and 88, respectively, as shown in FIG. 5(b). The outputs of those AND gates feed the inputs to an OR gate 90, whose output drives an input to an AND gate 92, another input to the AND gate being the clock signal 60. The output of the AND gate 92 produces the gating signal 72 for clocking the second check bit generator 58. In this case, the data word bits are arranged in the input register 52 as shown in FIG. 5(b).

Figure 6:
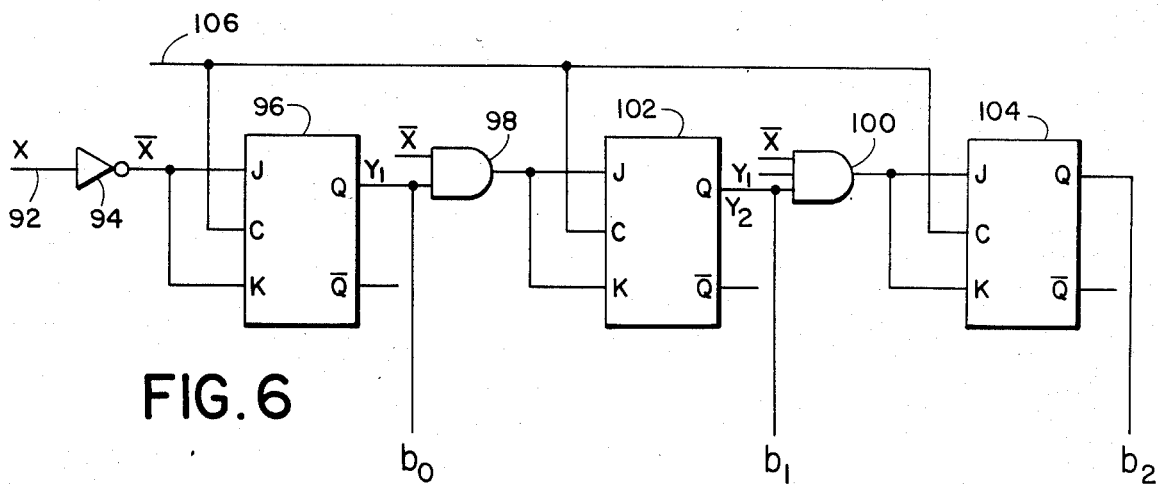
FIG. 6 shows a sequential logic circuit for generating three check bits.

Turning now to the construction of check code generators, FIG. 6 shows a sequential logic circuit for generation of three check bits $b_0$–$b_2$, that is a modulo eight counter. The serial information code data X is supplied at input 92 to inverter 94, which converts zeros to ones. The output of the inverter drives the J and K inputs of a J-K flip-flop 96, one input of an AND gate 98, and one input of an AND gate 100. The "on" (Q) output of flip-flop 96 also drives AND gate 98, whose output drives the J and K inputs of another J-K flip-flop 102. The Q output of that flip-flop in turn also drives the AND gate 100, whose output drives the J and K inputs of a J-K flip-flop 104. The respective Q outputs of the J-K flip-flops 96, 102, and 104 provide the check bits $b_0$–$b_2$. The clock inputs of those flip-flops are driven by a clock signal 106. The construction and operation of such a modulo eight counter are commonly understood in the art.

While FIG. 6 shows a modulo eight counter, appropriate for use in the examples shown in FIG. 3(a) and 5(a), that is, the use of three check bits to detect up to three unidirectional errors, it is to be understood that the use of two check bits can be implemented by a modulo four counter and the use of four check bits can be implemented by a modulo eight counter, with the fourth check bit being created by complementing the third check bit. This is equivalent to adding a binary four (0100) to the output of the modulo eight counter. The construction and operation of such circuits are commonly known in the art.

In addition, the aforedescribed first method for producing a check code of five or more bits can be implemented by constructing a modulo $2^{m-1}$ counter and creating the most significant check bit by complementing the most significant output bit of that counter.

Figure 7:
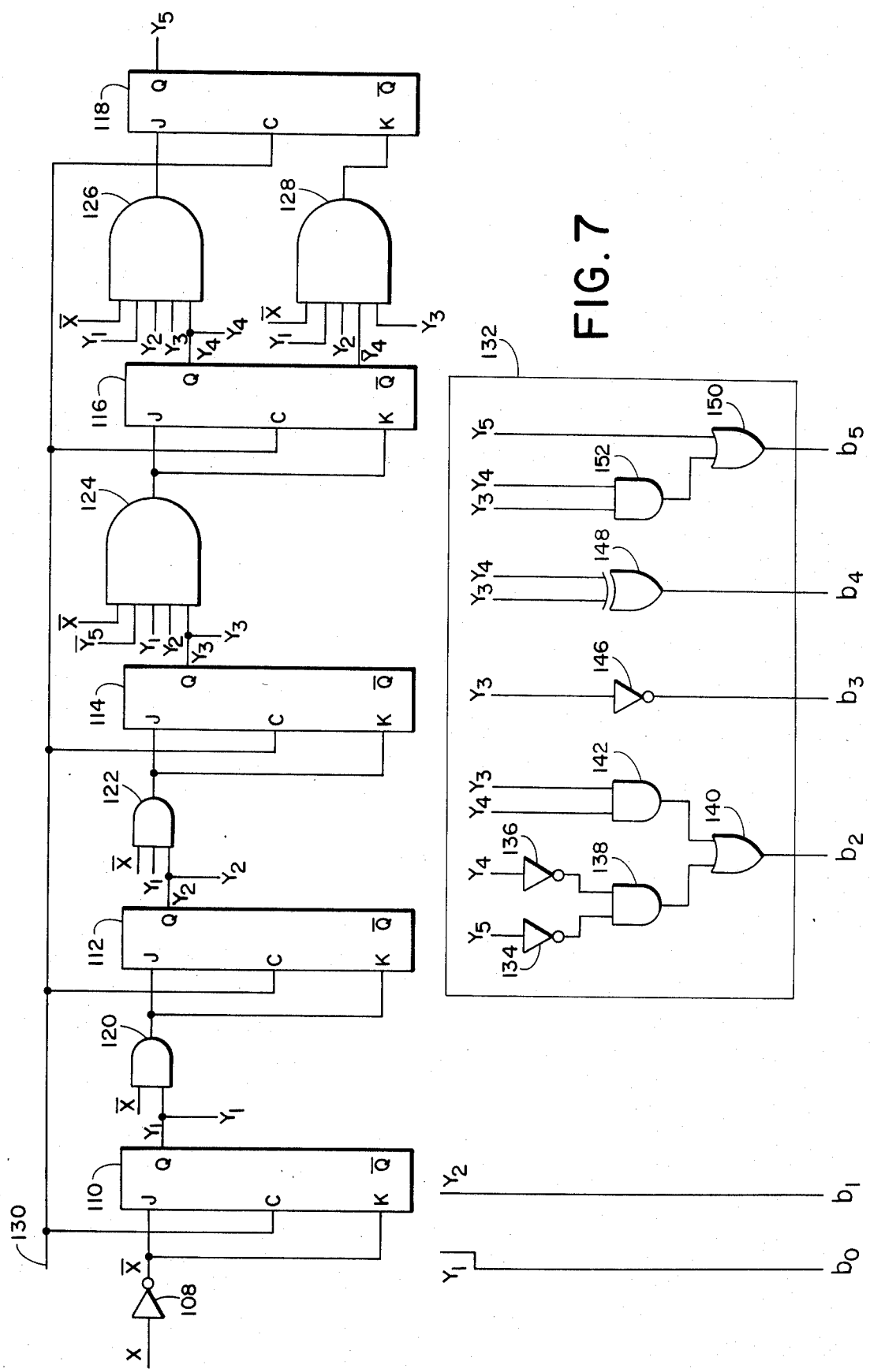
FIG. 7 shows a sequential logic circuit for generating six check bits.

A circuit for implementing the second method of producing a check code having five or more check bits is shown in FIG. 7. In this example, where six check bits are to be produced, a modulo 24 counter is constructed in a conventional manner using five J-K flip-flops 110, 112, 114, 116, and 118, and five AND gates 120, 122, 124, 126, and 128, interconnected as shown in FIG. 7. The first flip-flop 110 is driven by an inverter 108 responsive to a serial information code for converting zeros to ones. All flip-flops are driven by a clock signal 130.

The three most significant bits $Y_3$-$Y_5$ of the outputs of the modulo 24 counter are applied to a translator circuit 132 to produce the four most significant bits of the check code, thereby providing the aforedescribed mapping function, f. The translator circuit, which employs combinational logic, comprises two inverters 134 and 136 responsive to bits $Y_4$-$Y_5$, respectively, of the modulo 24 counter, and whose outputs drive an AND gate 138 which drives an OR gate 140 to supply check bit $b_2$. The latter is also driven by another AND gate 142 responsive to bits $Y_3$ and $Y_4$ out the modulo 24 counter. An inverter 146 supplies check bit $b_3$ in response to the $Y_3$ output of the modulo 24 counter. Check bit $b_4$ is supplied by an EXOR gate 148, which receives the $Y_3$ and $Y_4$ outputs from the counter. Check bit $b_5$ is provided by an OR gate 150 which receives as inputs the $Y_5$ input from the counter, and the output of an AND gate 152 whose inputs are the $Y_3$ and $Y_4$ outputs of the counter. Check bits $b_0$ and $b_1$ correspond to counter outputs $Y_1$ and $Y_2$.

For systems employing a greater number of check bits m, a modulo $6 \times 2^{m-4}$ counter is constructed and the same translator circuit is employed to translate the three most significant bits of the output of the counter to the four most significant bits of the check code, thereby providing the mapping function, f, the remaining least significant bits of the output of the counter forming the remaining least significant bits of the check code.

In the case of burst error detection, a modulo $2^m$ counter which increments for every zero input information bit can be used to generate the m-check bits. Construction of such a counter is a straightforward matter to a person skilled in the art.

Figure 8:
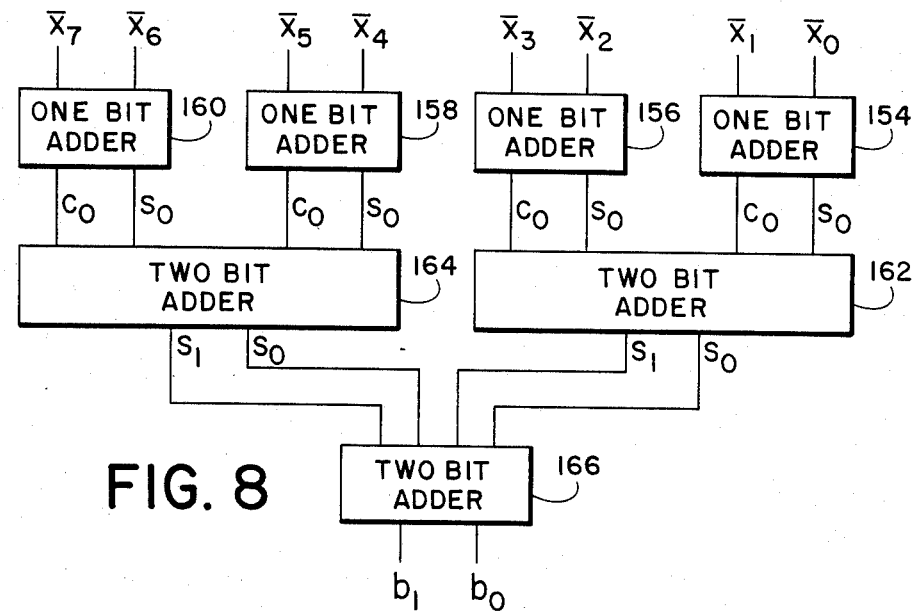
FIG. 8 shows a combinational logic circuit for generating two check bits.

Combinational logic may also be employed to produce the check bits, and would ordinarily be employed for parallel transmission channel applications. The construction of such logic is straightforward to a person skilled in the art. However, FIG. 8 shows an example of a tree-type two's complement adder constructed of combinational logic to produce two check bits $b_0$-$b_1$ from eight information bits $X_0$-$X_7$. This adder performs a modulo 4 arithmetic operation on the information bits. In the adder each consecutive pair of information bits is applied to a respective one-bit adder 154, 156, 158, and 160. The sum $S_0$ and carry $C_0$ outputs of each one-bit adder are applied to a two-bit adder, the outputs from the first two one-bit adders being applied to two-bit adder 162 and the outputs from the second two-bit adders being applied to two-bit adder 164. The sum outputs $S_0$ and $S_1$ of each two-bit adder are supplied as inputs to yet another two-bit adder 166, the carry bit output of the two-bit adders 162 and 164 being ignored. The sum outputs of the two-bit adder 166 supply the check bits $b_0$ and $b_1$, the carry bit being ignored. A circuit of this type could be employed in the embodiments shown in FIGS. 3(b) and 4, where three check bits are desired, and that where more check bits are used, a similar adder may be constructed. The construction and operation of such circuits is commonly known to a person skilled in the art and will not be dealt with any further here.

Figure 9:
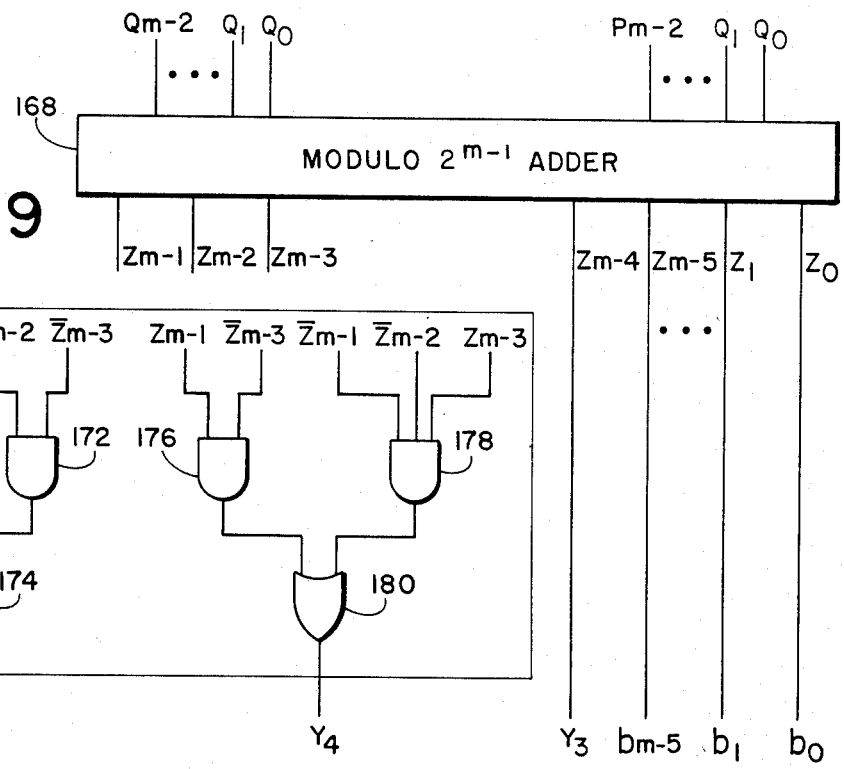
FIG. 9 shows a combinational logic circuit for generating any number of check bits.

Finally, in accordance with the aforementioned second method for generating five or more check bits, those check bits may be generated by combinational logic as shown in FIG. 9. First, a tree of adders similar to that shown in FIG. 8 is constructed of a plurality of i-bit adders (that is, adders having two i-bit inputs and one (i+1)-bit output), where i corresponds to tree logic levels 1, 2, 3, ..., (m−3). For logic levels m−2, m−1, m, m+1, ..., $\log_2 n$, a modulo $6 \times 2^{m-4}$ adder is used. The construction and operation of such adders is known to persons skilled in the art. However, an example of such a modulo $6 \times 2^{m-4}$ adder for the $\log_2 n$ logic level is shown in FIG. 9. Such an adder is constructed from a $2^{m-1}$ adder 168 plus the combination of AND gates 170, 172, 176 and 178 and OR gates 174 and 180, interconnected as shown in FIG. 9. The three most significant bits of the output of the modulo $6 \times 2^{m-4}$ counter are then applied to the translator circuit 132 shown in FIG. 7 to produce the four most significant bits of the check bits, the remaining check bits corresponding to the least significant bits of the output of that adder.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. In a data transmission system having a data source for producing an n-bit information code, a data sink for accepting a data word, and a data transmission channel for transmitting a data word from said data source to said data sink, a system for detecting at least t unidirectional errors in the transmission of said information code over said data transmission channel, comprising:

(a) first code generation means, associated with said data source, for producing, for a given information code in a predetermined set of n-bit information codes produced by said data source, a first m-bit check code according to the criteria that for all possible pairs of (n+m)-bit data words formed by said predetermined set of n-bit information codes and corresponding m-bit check codes, either the pair of words is unordered or the Hamming distance between the data words of the pair is greater than or equal to t+1, and there is at least one pair of said data words which is unordered and whose Hamming distance is less than t+1;

(b) transmission means for transmitting over said transmission channel a data word comprising an information code and its corresponding first check code;

(c) second code generation means, associated with said data sink, for producing, for a given information code accepted by said data sink, a second m-bit check code according to said criteria; and (d) comparator means, associated with said data sink, for comparing, for a given data word accepted by said data sink, said first check code and said second check code and producing an indication of any disparity therebetween.

2. The error detection system of claim 1 wherein m is equal to 2 or 3, and said first and second code generation means each includes means for producing said first and second check codes, respectively, by determining the number of zeros in a given information code and taking modulo $2^m$ thereof, all in binary arithmetic.

3. The error detection system of claim 1 wherein m is equal to 2 or 3, and said first and second code generation means each includes means for producing said first and second check codes, respectively, by determining the number of one's in a given information code, taking modulo $2^m$ thereof, and complementing the result, all in binary arithmetic.

4. The error detection system of claim 1 wherein m is equal to 4, and said first and second code generation means each includes means for producing said first and second check codes, respectively, by determining the number of zeros in a given information code, taking modulo 8 of that number, and adding 4 to the result, all in binary arithmetic.

5. The error detection system of claim 1 wherein m greater than or equal to 5, and said first and second code generation means each includes means for producing said first and second check codes, respectively, by determining the number of zeros in a given information code, taking modulo $2m^{-1}$ of that number, and adding $2m^{-1}$ to the result, all in binary arithmetic.

6. The error detection system of claim 1 wherein m is greater than or equal to 5, and said first and second code generation means each includes means for producing said first and second check codes, respectively, by determining the number of zeros in a given information code, taking modulo $6 \times 2^{2m-4}$ thereof, all in binary arithmetic, and mapping the three most significant bits of the result to 2-out-of-4 vectors by a one-to-one mapping function.

7. The error detection system of claim 1 wherein m is greater than 2 and n is greater than or equal to $2^m$, said first and second code generation means each includes means for producing said first and second check codes, respectively, by determining the number of zeros in a given information code and taking modulo $2^m$ of that number, in binary arithmetic, and said transmission means includes means for constructing a data word by arranging the bits of the data word in a sequence beginning with the $n-2^{m-1}$ most significant bits of said given information code, followed by the most significant bit of its corresponding first check code, followed by the remaining bits of said given information code, followed by the remaining bits of said first check code.

8. A method for detecting at least t unidirectional errors in the transmission of an information code over a data transmission channel, comprising:

(a) for a given information code in a predetermined set of n-bit information codes to be transmitted over said transmission channel, producing a corresponding first m-bit check code according to the criteria that for all possible pairs of (n+m)-bit data words formed by said predetermined set of n-bit information codes and corresponding m-bit check codes, either the pair of words is unordered or the Hamming distance between the data words of the pair is greater than or equal to t+1, and there is at least one pair of said data words which is unordered and whose Hamming distance is less than t+1;

(b) transmitting over said transmission channel along with a given information code its corresponding first check code;

(c) for a given information code received over said transmission channel, producing a second m-bit check code according to said criteria; and (d) comparing said first check code as received over said transmission channel with said second check code to ascertain the existence of any disparity therebetween.

* * * * *

UNITED STATES PATENT AND TRADEMARK OFFICE
CERTIFICATE OF CORRECTION

PATENT NO. : 4,691,319

DATED : September 1, 1987

INVENTOR(S) : Bella Bose

It is certified that error appears in the above-identified patent and that said Letters Patent is hereby corrected as shown below:

| | |
|---|---|
| Col. 2, line 57 | Replace "uni-directional" with --unidirectional--. |
| Col. 5, line 1 | After "significant", insert --bits of the information code, followed by the most significant--. |
| Col. 7, line 37 | Replace "out" with --of--. |
| Col. 7, line 37 | Insert a space after "$b_3$". |
| Col. 9, line 39 | Replace "$2m^{-1}$" with --$2^{m-1}$--. |
| Col. 9, line 40 | Replace "$2m^{-1}$" with --$2^{m-1}$--. |

Signed and Sealed this

Twenty-first Day of February, 1989

*Attest:*

DONALD J. QUIGG

*Attesting Officer*   *Commissioner of Patents and Trademarks*